(12) United States Patent
Valencia et al.

(10) Patent No.: US 10,972,815 B2
(45) Date of Patent: Apr. 6, 2021

(54) SIGNAL DETECTION FOR GPON OPTICAL LINE TERMINAL

(71) Applicant: Semtech Corporation, Camarillo, CA (US)

(72) Inventors: Miguel Valencia, Bristol (GB); Nirmal Bissonauth, Bristol (GB)

(73) Assignee: Semtech Corporation, Camarillo, CA (US)

( * ) Notice: Subject to any disclaimer, the term of this patent is extended or adjusted under 35 U.S.C. 154(b) by 5 days.

(21) Appl. No.: 16/401,107

(22) Filed: May 1, 2019

(65) Prior Publication Data

US 2020/0351577 A1    Nov. 5, 2020

(51) Int. Cl.
  *H04Q 11/00* (2006.01)
  *H04B 10/077* (2013.01)

(52) U.S. Cl.
  CPC ..... *H04Q 11/0067* (2013.01); *H04B 10/0775* (2013.01); *H04B 10/0777* (2013.01); *H04Q 2011/0083* (2013.01)

(58) Field of Classification Search
  None
  See application file for complete search history.

(56) References Cited

U.S. PATENT DOCUMENTS

| | | | |
|---|---|---|---|
| 5,528,185 A | 6/1996 | Lewicki et al. | |
| 5,859,569 A * | 1/1999 | Le | H03F 1/52 330/207 P |
| 6,826,390 B1 | 11/2004 | Tamura | |
| 7,269,347 B1 * | 9/2007 | Matricardi | H04B 10/66 398/24 |
| 2002/0051271 A1 * | 5/2002 | Yoshikoshi | H04B 10/695 398/202 |
| 2004/0240892 A1 * | 12/2004 | Abidin | H04B 10/695 398/214 |
| 2007/0104494 A1 * | 5/2007 | Murayama | H04B 10/66 398/202 |
| 2012/0212259 A1 | 8/2012 | Riva et al. | |
| 2013/0039649 A1 * | 2/2013 | Koizumi | H04B 10/697 398/25 |
| 2018/0033814 A1 * | 2/2018 | Chalmers, Jr. | H01L 27/14601 |

* cited by examiner

*Primary Examiner* — David W Lambert (74) *Attorney, Agent, or Firm* — Robert D. Atkins; Patent Law Group: Atkins and Associates P.C.

(57) ABSTRACT

A signal detection circuit has a first differential amplifier including a first input coupled for receiving a data signal, and a second input coupled for receiving a threshold signal. A current steering circuit is coupled to an output of the first differential amplifier to establish a threshold for the first differential amplifier. A latch has an input coupled to the output of the first differential amplifier for latching a signal detect. A second amplifier has an input coupled to the output of the first differential amplifier and an output coupled to the input of the latch. A third amplifier has an input coupled to the output of the first differential amplifier and an output providing the data signal. The current steering circuit can be disabled which removes the need for the third amplifier as the data signal path is through second amplifier.

20 Claims, 8 Drawing Sheets

SIGNAL DETECTION FOR GPON OPTICAL LINE TERMINAL

FIELD OF THE INVENTION

The present invention relates in general to a passive optical network and, more particularly, to a signal detection circuit for a GPON optical line terminal.

BACKGROUND OF THE INVENTION

A gigabit passive optical network (GPON) provides high speed data communications, over a fiber optical cable, between an internet service provider (ISP) and end user. A GPON uses point-to-multipoint architecture (1:32) or (1:64) with a fiber optic splitter to serve multiple end-points from a single optical source. For example, the GPON includes an optical line terminal (OLT) at the ISP central office or switching center and a plurality of optical network units (ONU) or optical network terminals (ONT) located near the end users. Each ONU serves an individual end user. A GPON reduces the amount of fiber and central office equipment as compared with other networks since unpowered fiber optic splitters are used to enable a single optical fiber to serve multiple end-points.

The GPON is a shared network, in that the OLT sends a stream of data packets as downstream traffic that is seen by all ONUs. The OLT transmitter and ONU receiver operate in continuous mode (CM). Each ONU reads the content of the data packets that correspond to the particular ONU address. Encryption prevents eavesdropping on downstream traffic. However, in the upstream channel, the ONU typically cannot transmit the optical data signal in CM, because there are more ONUs than OLTs and the receive timing of the optical data signal is variable. Instead, signals are combined using a multiple access protocol, such as time division multiple access (TDMA). Therefore, a given ONU transmits an optical packet in an assigned time slot using burst mode (BM) transmission. All ONUs use the same clock frequency as the OLT as they extract the frequency from the downstream channel by using a clock and data recovery (CDR) circuit.

Many ONUs are geographically dispersed and operate at least partially out-of-phase because of the distance and delay to the OLT. The optical signals from different ONUs also experience different attenuation. Accordingly, the OLT receives BM optical packages from different ONUs that are asynchronous, out-of-phase, and with different amplitudes. The OLT must identify the preamble of the burst mode transmission. The OLT can then compensate for signal degradation from the phase and amplitude variation of the optical signal.

To identify a valid preamble, a conventional amplitude detector uses two identical signal paths with a large gain-bandwidth product (GBWP). A threshold signal is routed through one signal path and a data signal needing amplitude detection goes through the other signal path. Each signal path requires a large gain due to attenuation (>28 dB) of potential signals (<5 mV) in the system. The output signals from the two signal paths are compared to confirm a valid preamble. The dual signal paths use more real estate on the semiconductor chip and require more power. The accuracy can be affected by small offsets between the two discrete signal paths.

DETAILED DESCRIPTION OF THE DRAWINGS

The present invention is described in one or more embodiments in the following description with reference to the figures, in which like numerals represent the same or similar elements. While the invention is described in terms of the best mode for achieving the invention's objectives, those skilled in the art will appreciate that the description is intended to cover alternatives, modifications, and equivalents as may be included within the spirit and scope of the invention as defined by the appended claims and the claims' equivalents as supported by the following disclosure and drawings.

Figure 1:
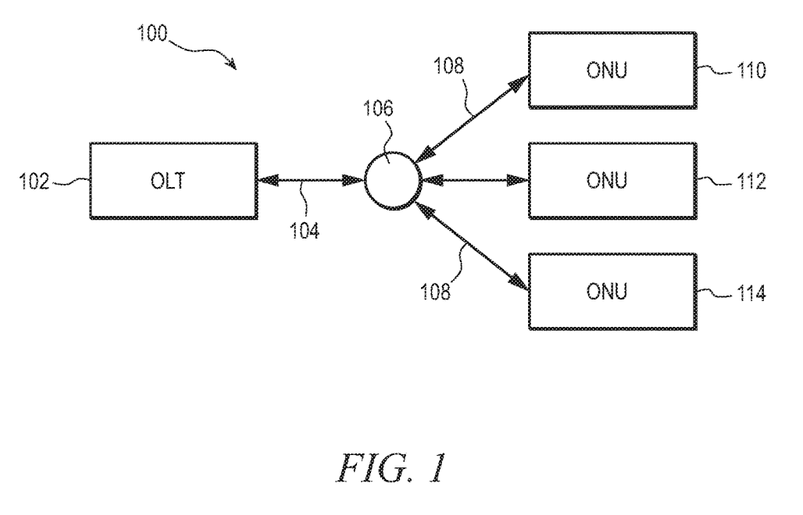
FIG. 1 illustrates a gigabit passive optical network with OLT, optical splitter, and a plurality of ONUs.

FIG. 1 illustrates GPON 100 providing high speed data communications, over fiber optical cable, between an ISP and end users. GPON 100 includes OLT 102 located within the ISP home office or switching center. OLT 102 makes connection with the internet. OLT 102 is coupled through fiber optical cable 104 to optical splitter 106, which provides multiple optical signal paths through fiber optical cables 108 to ONU 110, 112, and 114 located near end users. In one embodiment, optical splitter 106 connects up to 64 ONUs and brings optical fiber cabling and signals to the end user.

GPON 100 is a shared network, in that OLT 102 sends a stream of data packets as downstream traffic through fiber optical cables 104 and 108 to ONU 110-114. Each ONU 110-114 reads the content of the data packets that correspond to the particular ONU address. Encryption prevents eavesdropping on downstream traffic. In the upstream channel, the ONU transmits the optical data signal using a multiple access protocol, such as TDMA. A given ONU transmits an optical packet in an assigned time slot using BM transmission. All ONUs use the same clock frequency as the OLT as they extract the frequency from the downstream channel by using a CDR circuit.

The present invention is also applicable to gigabit ethernet passive optical network (GEPON), EPON, 10G-EPON, XGPON, XGSPON, 25G-EPON, 50G-EPON, and other burst PON applications for sending data packets.

Figure 2:
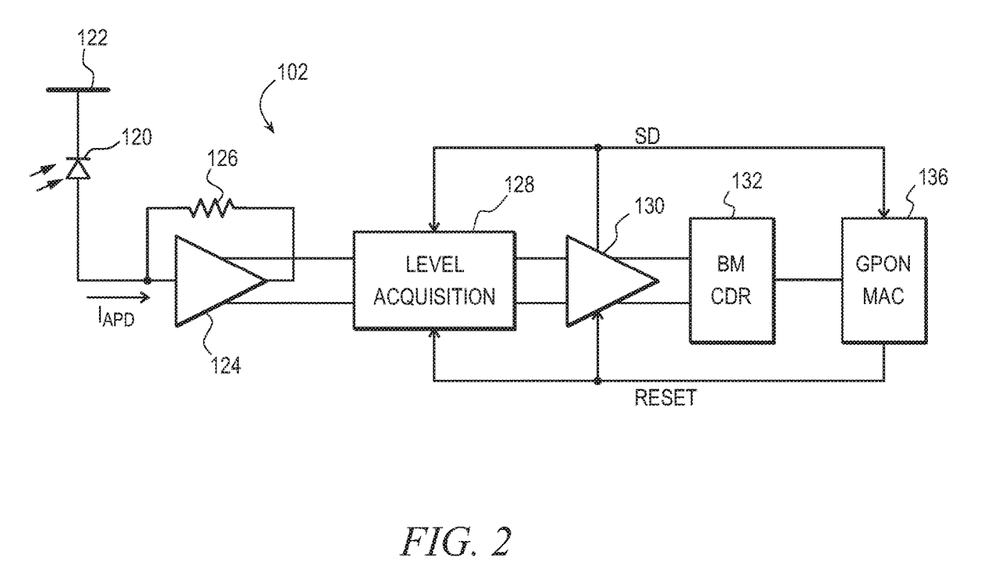
FIG. 2 illustrates further detail of the OLT of the GPON.

FIG. 2 illustrates further detail of the receiver portion of OLT 102, i.e., receiving the upstream optical data signal in bursts from ONU 110-114. Avalanche photodiode (APD) 120 detects the upstream optical data signal from ONU 110-114. The cathode of APD 120 is coupled to a positive power supply conductor 122, and the anode is coupled to an input of BM transimpedance amplifier (TIA) 124. APD 120 converts the optical data signal to current $I_{APD}$. BM TIA 124 converts $I_{APD}$ to a voltage representative of the received optical data signal, and resistor 126 sets the gain of BM TIA 124. The differential output of BM TIA 124 is coupled to a differential input of level acquisition circuit 128. The differential output of level acquisition circuit 128 is coupled to a differential input of BM limiting amplifier (LIA) 130, and the differential output of BM LIA 130 is coupled to a differential input of BM CDR 132. GPON medium access control (MAC) 136 controls the communication between downstream data and upstream data. GPON MAC 136 generates RESET at each burst cycle to reset level acquisition circuit 128 and BM LIA 130.

Figure 3:
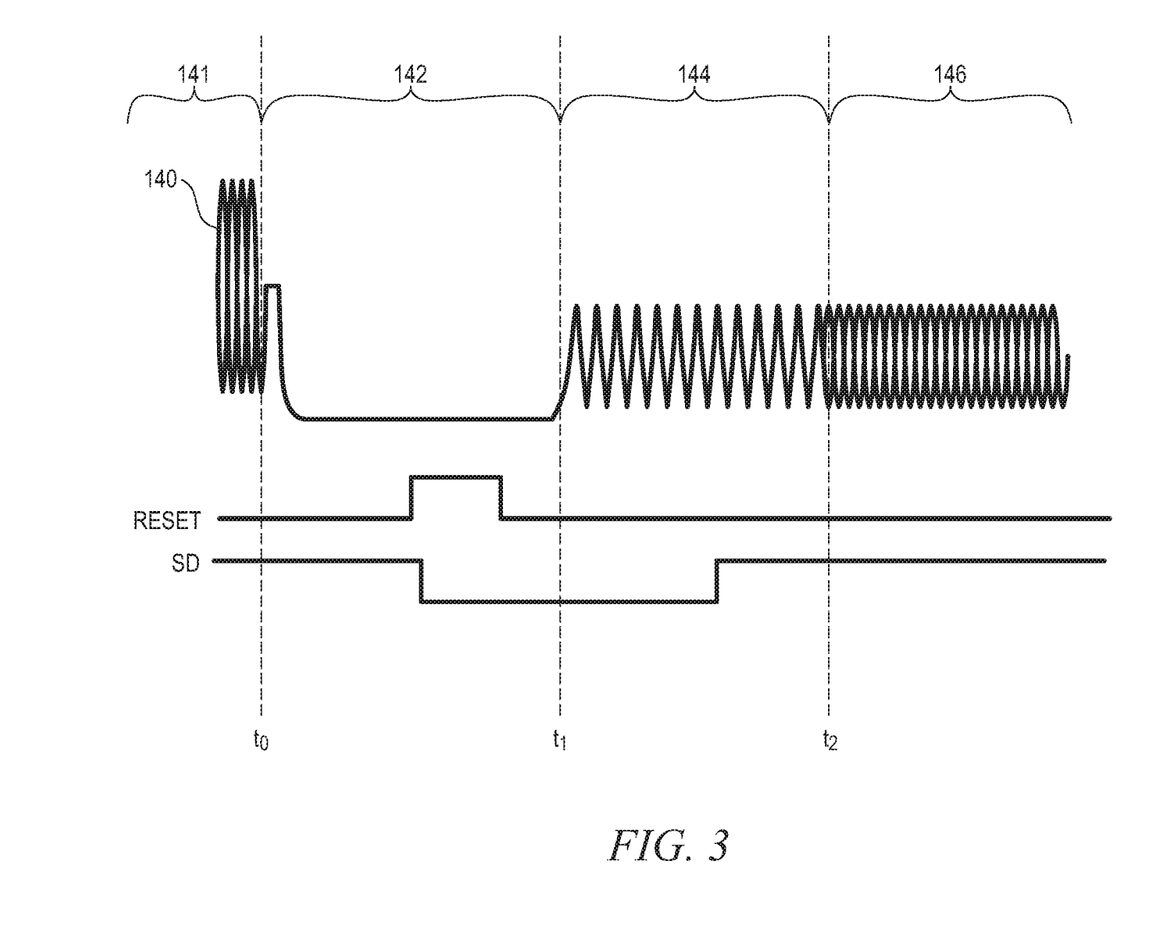
FIG. 3 illustrates a timing diagram of a received data signal and control signals.

An upstream data signal 140 is received by APD 120 of OLT 102 in FIG. 3. Time $t_0$ marks the end of a previous data payload 141. Guard interval 142 ensures that ONUs 110-114 do not interfere with one another, or otherwise cause overlapping transmissions. During guard interval 142, GPON MAC 136 generates RESET to prepare for processing the next burst of data. The incoming burst of data has an unknown amplitude that must be detected and accommodated or compensated for. BM LIA 130 keeps the signal detect SD asserted from the previous burst until the signal detect is reset or cleared by RESET from the MAC 136. RESET may arrive from MAC 136 either during guard time interval 142 or during preamble 144. Preamble 144 begins at time $t_1$ with a sequence of alternating logic ones and logic zeroes. Signal detect SD should be asserted during preamble 144 and remains asserted until it is cleared by another RESET. BM TIA 124 and BM LIA 130 use the time period of preamble 144 to compensate for amplitude variation of data signal 140 and for BM 132 to phase-align with the transmitting ONU. The next data payload 146 begins at time $t_2$. Guard time 142 and preamble 144 represent overhead of the communication protocol and should be short in duration, e.g., 25.7 nanosecond (ns) guard time and 35.4 ns preamble at 1.244 Gbps.

BM TIA 124 handles a wide range of amplitude variations in data payload 146, i.e., the amplitude of the data signal may be high or low. In the ideal case, the differential output signal of BM TIA 124 is symmetrical about a reference signal, such as 0.0 VDC. When the differential signal swings around a different voltage, that voltage difference to the ideal zero level is a DC offset. There should be no DC offset of the differential signal with respect to the reference signal (0.0 VDC). However, the optical signal from ONU 110 may be attenuated more or less than the optical signal from ONU 112 or 114. Accordingly, the optical signal from ONU 110 may have an amplitude greater than or less than the optical signal from ONU 112 or 114. For example, data payload 141 has a greater amplitude as compared to data payload 146. Due to such system variation, e.g., changes in optical signal amplitude from one burst to another burst, as well as variations in delay from ONU 110-114 to OLT 102, the differential output signal of BM TIA 124 may have a non-zero DC offset with respect to the reference signal (0.0 VDC) that is proportional to the amplitude of the input optical signal. Level acquisition circuit 128 creates a dynamic time constant for each burst cycle to remove or compensate for the DC offset from the differential signal from BM TIA 124. Under present design standards, there is a short time to remove the DC offset. Level acquisition circuit 128 is described in detail in U.S. application Ser. No. 16/271,824, "Dynamic Time Constant for Quick Decision Level Acquisition", which is incorporated herein by reference.

Figure 4:
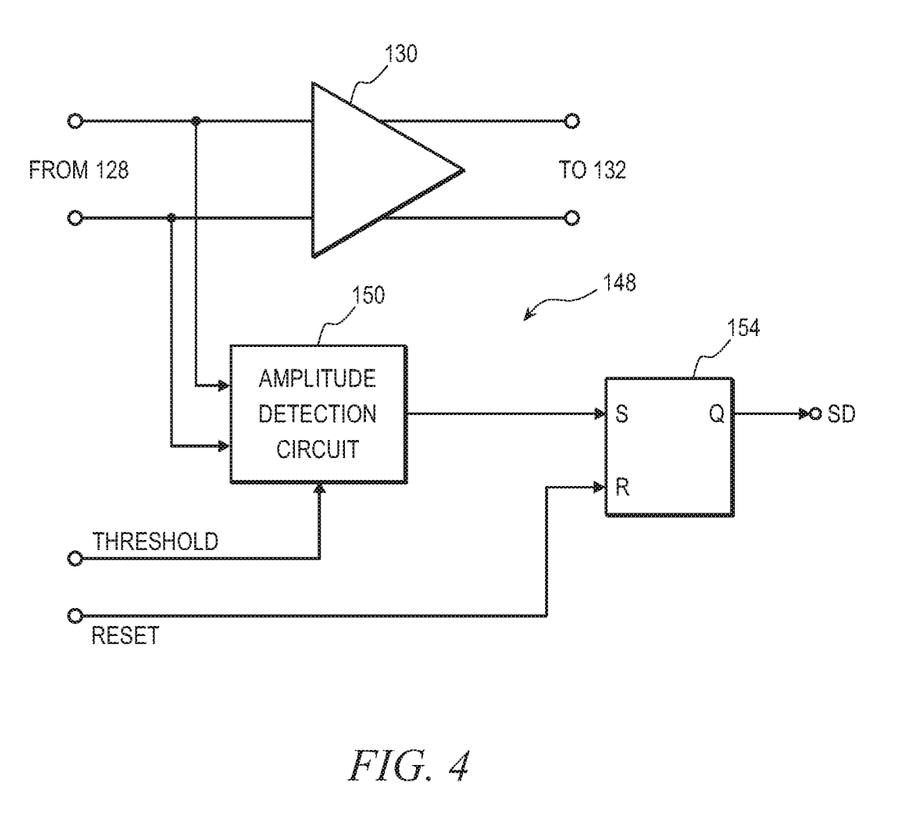
FIG. 4 illustrates further detail of the BM LIA and signal detection circuit in the OLT.

FIG. 4 illustrates BM LIA 130 and detection circuitry 148 for generated signal detect SD. Signal detect SD is asserted when preamble 144 is confirmed to be valid. The differential output of level acquisition circuit 128 is also coupled to amplitude detection circuit 150. In particular, circuit 150 uses amplitude detection to confirm that an amplitude of data signal 140 is above a threshold value. A threshold signal is applied to amplitude detection circuit 150. The threshold value is typically set to detect the minimum amplitude for data signal 140, 146 to meet an error rate, which is typically lower than one bit in 1e10 bits. The output of amplitude detection circuit 150 is coupled to a set (S) input of flipflop 154. The reset (R) input of flipflop 154 receives the RESET signal, and the output (Q) of flipflop 154 provides signal detect SD.

Figure 5:
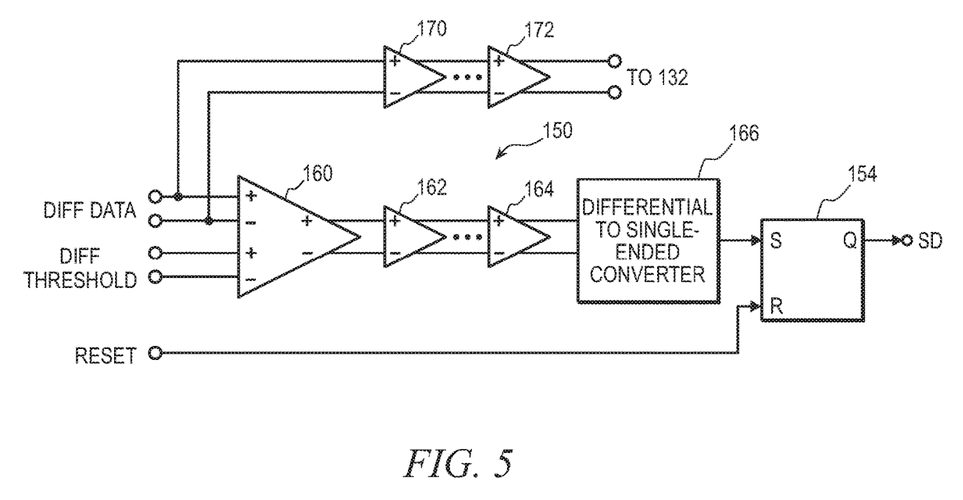
FIG. 5 illustrates an amplitude detection circuit using a differential comparator referenced to a differential threshold.

FIG. 5 illustrates further detail of detection circuitry 148 including a primary data signal path and data detection signal path. The primary data signal path for differential data signal 140 from level acquisition circuit 128 is through differential amplifier 170 and differential amplifier 172 (corresponding to amplifier 130). Additional amplifiers or gain stages like 170 and 172 can be used. The output of amplifier 172 is coupled to the input of BM CDR 132. Comparator 160 requires a large GBWP. Accordingly, comparator 160 is followed by multiple smaller gain stages, which are more readily implemented on a semiconductor die.

In the data detection signal path, differential comparator 160 has a first differential input coupled for receiving the differential data signal 140 from level acquisition circuit 128, and a second differential input coupled for receiving a differential threshold signal. Differential comparator 160 compares the differential data signal 140 and differential threshold signal. If the differential data signal 140 is above the differential threshold signal, comparator 160 provides a logic one differential output signal. If the differential data signal 140 is less than the differential threshold signal, comparator 160 provides a logic zero differential output signal. The differential output signal of comparator 160 is routed through differential amplifier 162, and the differential output of amplifier 162 is routed through differential amplifier 164. Additional amplifiers or gain stages like 162 and 164 can be used. Differential to single-ended converter 166 converts the differential signal to single-ended. The output of converter 166 is coupled to a set (S) input of flipflop 154. The reset (R) input of flipflop 154 receives the RESET signal, and the output (Q) of flipflop 154 provides signal detect SD. If the differential data signal 140 is above the differential threshold signal, SD is logic one. If the differential data signal 140 is less than the differential threshold signal, SD is logic zero.

Figure 6:
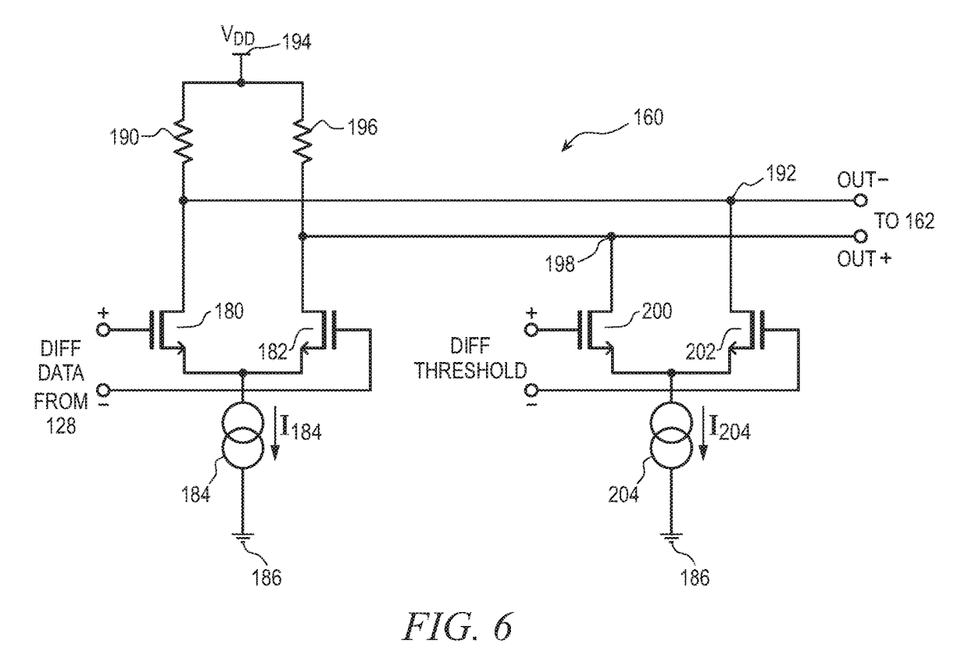
FIG. 6 illustrates further detail of the differential comparator of FIG. 5.

FIG. 6 illustrates an implementation of differential comparator 160. The differential data signal 140 is applied to the gates of transistors 180 and 182. The sources of transistors 180 and 182 are coupled to current source 184, which is referenced to power supply terminal 186 operating at ground potential. Current source 184 provides a fixed reference current $I_{184}$. Resistor 190 is coupled between node 192 at the drain of transistor 180 and power supply terminal 194 operating at a positive voltage $V_{DD}$. Resistor 196 is coupled between node 198 at the drain of transistor 182 and power supply terminal 194. The differential threshold signal is applied to the gates of transistors 200 and 202. The sources of transistors 200 and 202 are coupled to current source 204, which is referenced to power supply terminal 186. Current source 204 provides a fixed reference current $I_{204}$. The drains of transistors 200 and 202 are coupled to nodes 198 and 192, respectively. Node 198 is the OUT⁺ of comparator 160, and node 192 is the OUT⁻ of the comparator.

Figure 7:
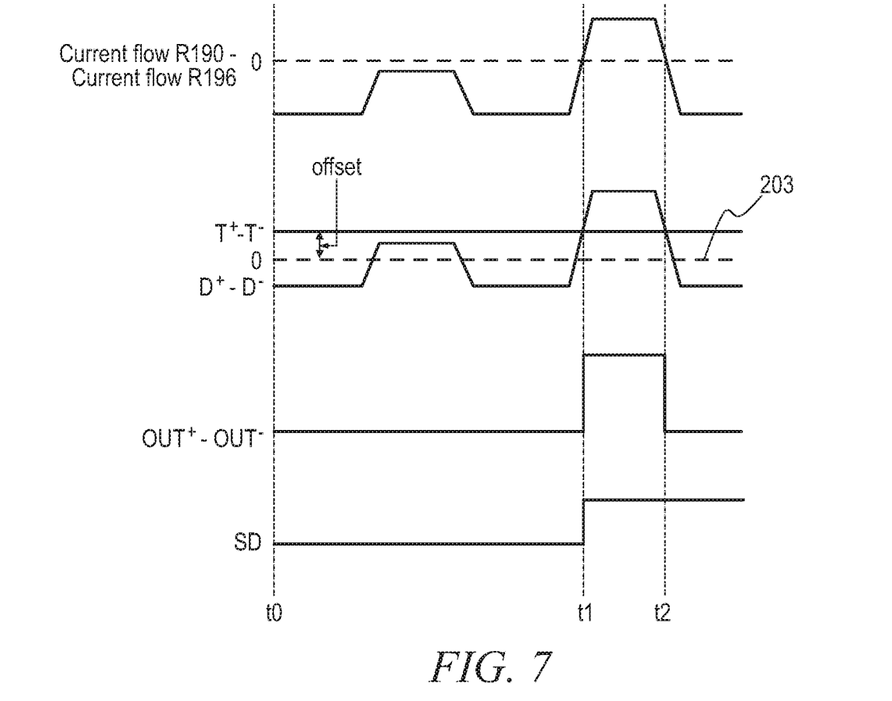
FIG. 7 illustrates a timing diagram of comparing the differential data signal to the differential threshold to determine signal detect.

FIG. 7 illustrates the operation of differential comparator 160. Between times $t_0$-$t_1$, differential data D⁺-D⁻ is less than differential threshold T⁺-T⁻. Resistor 196 conducts more current than resistor 190 because transistors 182 and 200 conduct more than transistors 180 and 202, respectively. Node 192 is a higher voltage than node 198 because more voltage is dropped across resistor 196 (transistor 182 pulls down more on node 198). OUT⁻ is a higher voltage than OUT⁺, hence the differential output OUT⁺-OUT⁻ of differential comparator 160 is low between times $t_0$-$t_1$. During time $t_1$-$t_2$, differential data D⁺-D⁻ is greater than differential threshold T⁺-T⁻. Resistor 190 now conducts more current than resistor 196 because transistor 180 conducts more than transistor 182. Node 198 is a higher voltage than node 192 because more voltage is dropped across resistor 190. OUT⁺ is a higher voltage than OUT⁻, hence the differential output OUT⁺-OUT⁻ of differential comparator 160 is high between times $t_1$-$t_2$. Line 203 identifies where D+ and D− are equal (and T+ and T− are equal), i.e. zero differential voltage.

Transistors 200 and 202 operate as a current steering circuit to establish a threshold for the differential amplifier 180-196 by creating an offset that differential data signal 140 must exceed, i.e., the different threshold, to switch the differential output OUT⁺ and OUT⁻. At time $t_1$, the output of converter 166 goes to logic one to set flipflop 154. The Q output of flipflop 154 goes to logic one to assert signal detect SD as logic one. After time $t_2$, differential data D⁺-D⁻ is again less than differential threshold T⁺-T⁻. OUT⁻ is a higher voltage than OUT⁺ as described above, hence the differential output OUT⁺-OUT⁻ of differential comparator 160 is low, as shown in FIG. 7. Signal detect SD remains asserted until reset by nature of flipflop 154. Differential comparator 160 can be implemented as a peak detector.

Figure 8:
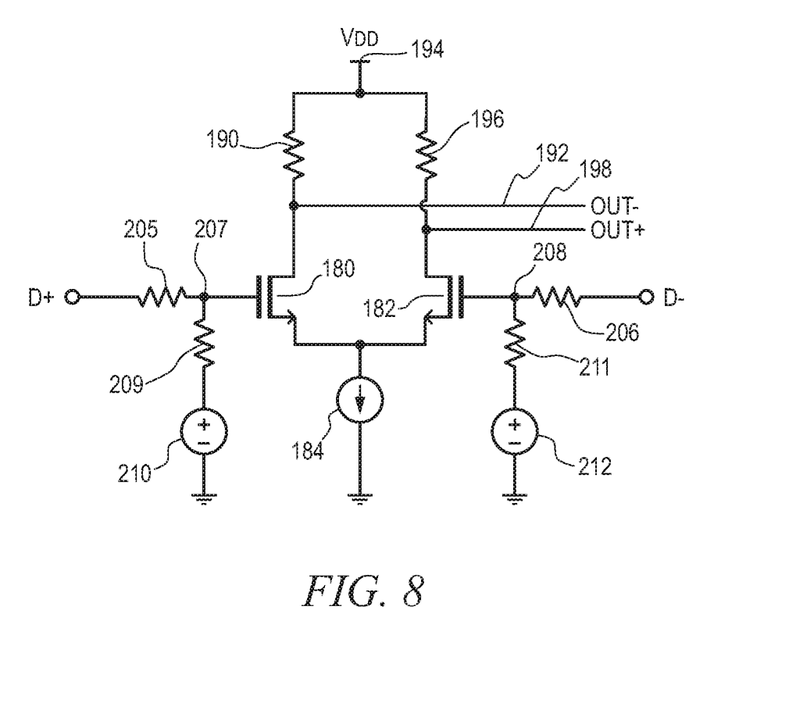
FIG. 8 illustrates an alternate embodiment for the front-end of the differential comparator.

FIG. 8 illustrates an alternate embodiment for the front-end of differential comparator 160. Components providing a similar function are assigned the same reference numbers as FIG. 6. Differential data D⁺-D⁻ is applied to resistors 205 and 206 to nodes 207 and 208 at the gates of transistors 180 and 182, respectively. Resistor 209 is coupled between node 207 and voltage source 210 with a value of T⁻, and resistor 211 is coupled between node 208 and voltage source 212 with a value of T⁺.

The implementations described in FIGS. 7-8 introduce an offset where D⁺ and D⁻ overcome such offset. Other circuit that add an offset could be used to generate SD.

Figure 9:
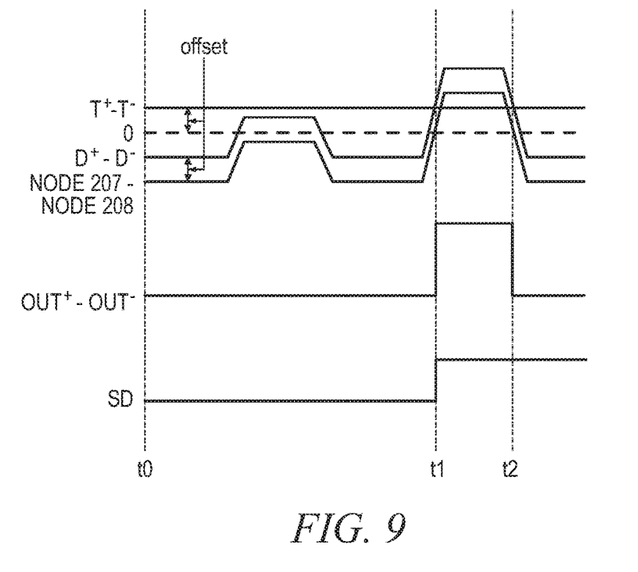
FIG. 9 illustrates a timing diagram of the operation of FIG. 8.

FIG. 9 illustrates the operation of the differential comparator with circuit elements 205-212. Differential comparator 160 detects a signal by introducing an offset (which for this specific case is the SD threshold). Differential data D⁺ and D⁻ needs to overcome that offset for SD to go high. Differential data D⁺ and D⁻ is offset by the amount of T⁺-T⁻ and therefore, D⁺-D⁻ needs to be larger to overcome the offset and cross zero volts.

Figure 10:
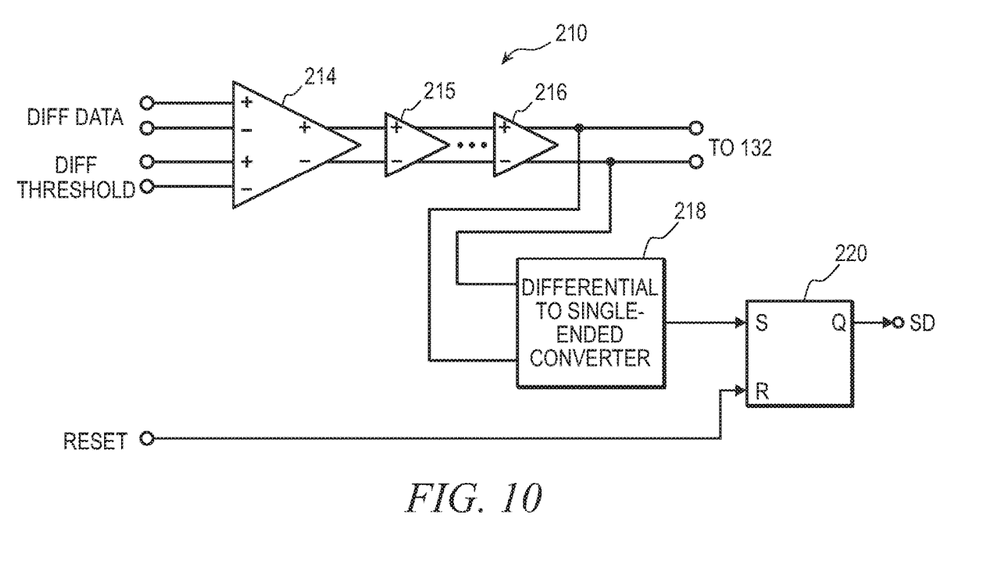
FIG. 10 illustrates another amplitude detection circuit using a differential comparator referenced to a differential threshold.

FIG. 10 illustrates amplitude detection circuit 210 similar to FIG. 5 minus the primary data signal path through amplifiers 170 and 172. In this case, differential comparator 214 and amplifiers 215 and 216 provide both functions of the primary data signal path and the data signal detection. Differential comparator 214 has a first differential input coupled for receiving the differential data signal 140 from level acquisition circuit 128, and a second differential input coupled for receiving a differential threshold signal. When enabled, differential comparator 214 compares the differential data signal 140 and differential threshold signal. If the differential data signal 140 is above the differential threshold signal, comparator 214 provides a logic one differential output signal. If the differential data signal 140 is less than the differential threshold signal, comparator 214 provides a logic zero differential output signal. The differential output signal of comparator 214 is routed through differential amplifier 215, and the differential output of amplifier 215 is routed through differential amplifier 216. Additional amplifiers or gain stages like 215 and 216 can be used. The differential output of amplifier 216 is also coupled to BM CDR 132 and serves as the primary data signal path when the comparator function is disabled, see discussion below. Differential to single-ended converter 218 converts the differential signal to single-ended. Converter 218 could be coupled to the output of comparator 214. The output of converter 218 is coupled to a set (S) input of flipflop 220. The reset (R) input of flipflop 220 receives the RESET signal, and the output (Q) of flipflop 220 provides signal detect SD. If the differential data signal 140 is above the differential threshold signal, SD is logic one. If the differential data signal 140 is less than the differential threshold signal, SD is logic zero.

Figure 11:
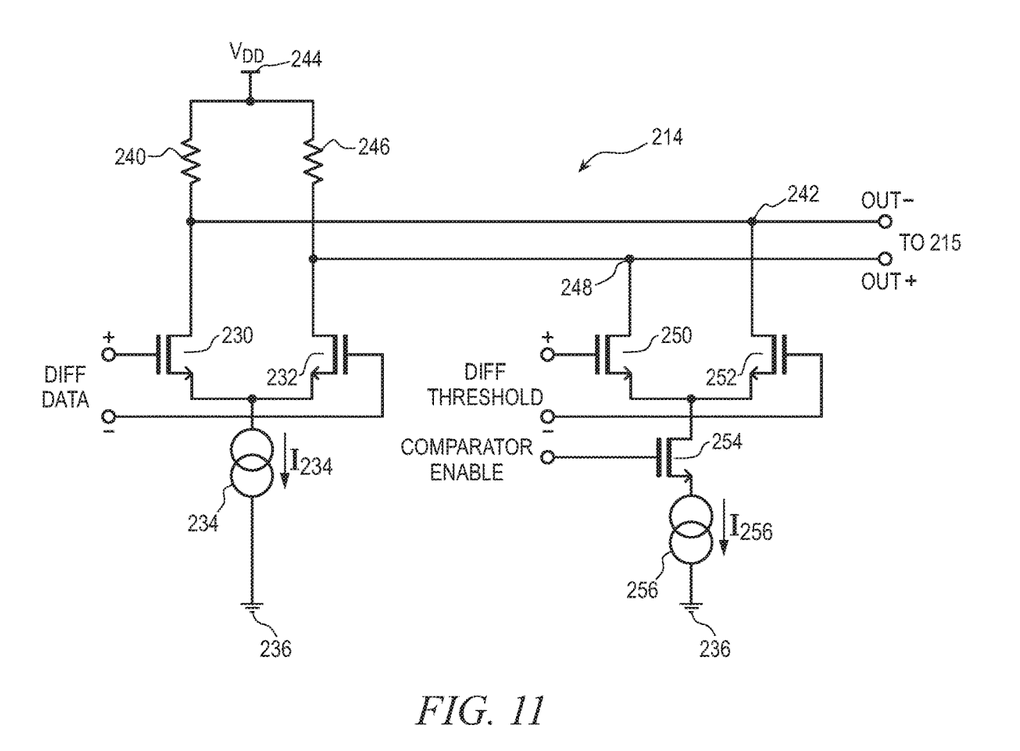
FIG. 11 illustrates further detail of the differential comparator of FIG. 10.

FIG. 11 illustrates an implementation of differential comparator 214. The differential data signal 140 is applied to the gates of transistors 230 and 232. The sources of transistors 230 and 232 are coupled to current source 234, which is referenced to power supply terminal 236 operating at ground potential. Current source 234 provides a fixed reference current $I_{234}$. Resistor 240 is coupled between node 242 at the drain of transistor 230 and power supply terminal 244 operating at a positive voltage $V_{DD}$. Resistor 246 is coupled between node 248 at the drain of transistor 232 and power supply terminal 244. The differential threshold signal is applied to the gates of transistors 250 and 252. The sources of transistors 250 and 252 are coupled to the drain of transistor 254. The gate of transistor 254 receives a comparator enable control signal, and the source of transistor 254 is coupled to current source 256, which is referenced to power supply terminal 236. Current source 256 provides a fixed reference current $I_{256}$. The comparator enable control signal goes high at the beginning of preamble 144 to enable the comparator function and goes low after signal detect SD is asserted (goes high) to disable the comparator function. The drains of transistors 250 and 252 are coupled to nodes 248 and 242, respectively. Node 248 is the OUT⁺ of comparator 214, and node 242 is the OUT⁻ of the comparator.

FIG. 7 also illustrates the operation of differential comparator 214. Between times $t_0$-$t_1$, differential data D⁺-D⁻ is less than differential threshold T⁺-T⁻. The comparator enable control signal is high to turn on transistor 254 and connect current source 256 to transistors 250 and 252 to enable the comparator function. Transistor 254 operates as a switch between current source 256 and transistors 250 and 252. Resistor 246 conducts more current than resistor 240 because transistors 232 and 250 conduct more than transistors 230 and 252, respectively. Node 242 is a higher voltage than node 248 because more voltage is dropped across resistor 246. OUT⁻ is a higher voltage than OUT⁺, hence the differential output OUT⁺-OUT⁻ of differential comparator 214 is low between times $t_0$-$t_1$. During time $t_1$-$t_2$, differential data D⁺-D⁻ is greater than differential threshold T⁺-T⁻. Resistor 240 now conducts more current than resistor 246 because transistors 230 and 252 conduct more than transistors 232 and 250. Node 248 is a higher voltage than node 242 because more voltage is dropped across resistor 240. OUT$^+$ is a higher voltage than OUT$^-$, hence the differential output OUT$^+$-OUT$^-$ of differential comparator 214 is high between times $t_1$-$t_2$.

Transistors 250 and 252 operate as a current steering circuit to establish a threshold for the differential amplifier 230-246 by creating an offset that differential data signal 140 must exceed, i.e., the different threshold, to switch the differential output OUT$^+$ and OUT$^-$. At time $t_1$, the output of converter 218 goes to logic one to set flipflop 220. The Q output of flipflop 220 goes to logic one to assert signal detect SD as logic one. After time $t_2$, differential data D$^+$-D$^-$ is again less than differential threshold T$^+$-T$^-$. OUT$^-$ is a higher voltage than OUT$^+$ as described above, hence the differential output OUT$^+$-OUT$^-$ of differential comparator 214 is low. Signal detect SD remains asserted until reset by nature of flipflop 220.

Once SD is asserted, the comparator enable control signal goes low to turn off transistor 254 and disable transistors 250 and 252. The comparator function is disabled, and transistors 230 and 232 of comparator 214 operate as a simple differential amplifier. The primary data signal path is through differential amplifier 230-246 (with the comparator function disabled) and amplifiers 215 and 216 to BM CDR 132.

Figure 12:
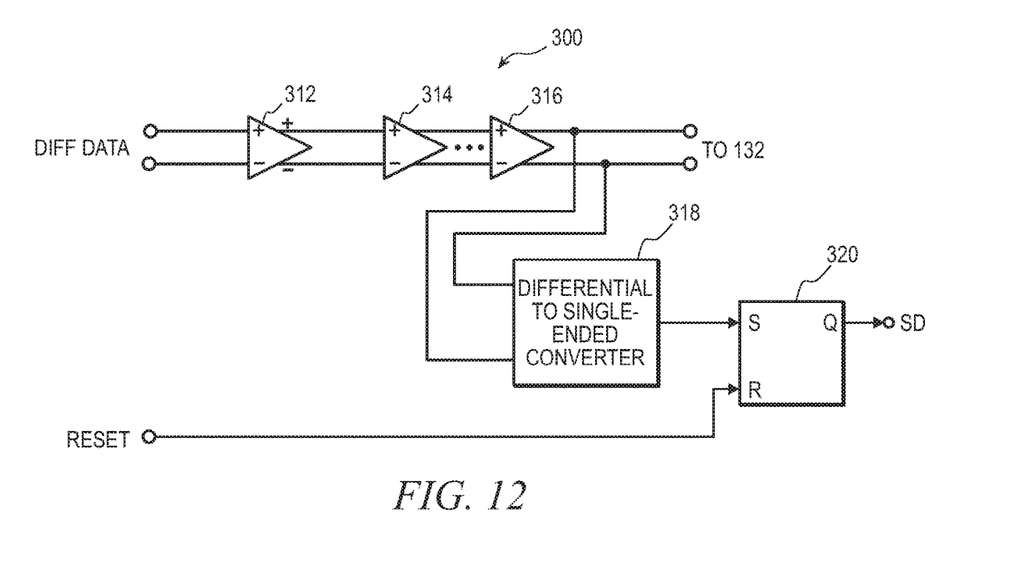
FIG. 12 illustrates another amplitude detection circuit using a differential amplifier and DAC.

FIG. 12 illustrates amplitude detection circuit 300 with differential amplifiers 312, 314, and 316 providing both functions of the primary data signal path and the data signal detection. Differential amplifier 312 has a differential input coupled for receiving the differential data signal 140 from level acquisition circuit 128. The differential output signal of amplifier 312 is routed through differential amplifier 314, and the differential output of amplifier 314 is routed through differential amplifier 316. Additional amplifiers or gain stages like 314 and 316 can be used. The differential output of amplifier 316 is also coupled to BM CDR 132 and serves as the primary data signal path. Differential to single-ended converter 318 converts the differential signal to single-ended. Converter 318 could be coupled to the output of amplifier 312. The output of converter 318 is coupled to a set (S) input of flipflop 320. The reset (R) input of flipflop 320 receives the RESET signal, and the output (Q) of flipflop 320 provides signal detect SD. If the differential data signal 140 is above the differential threshold signal, SD is logic one. If the differential data signal 140 is less than the differential threshold signal, SD is logic zero.

Figure 13:
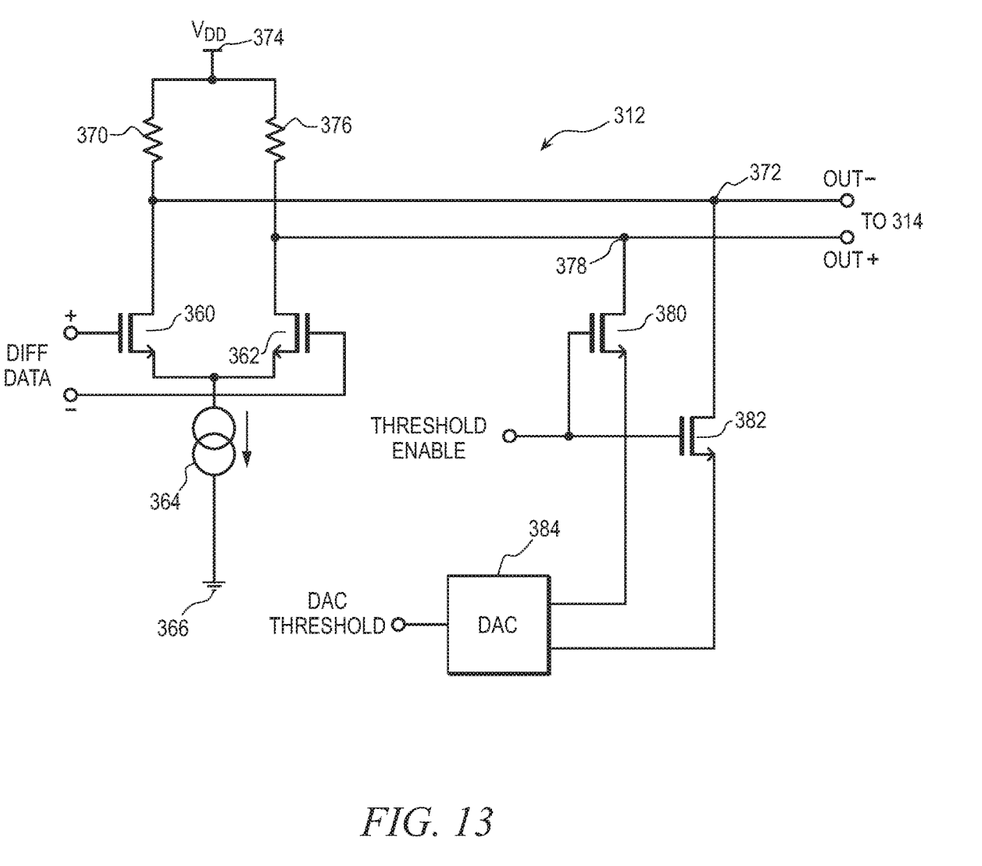
FIG. 13 illustrates further detail of the differential amplifier and DAC of FIG. 12.

FIG. 13 illustrates an implementation of differential amplifier 312. The differential data signal 140 is applied to the gates of transistors 360 and 362. The sources of transistors 360 and 362 are coupled to current source 364, which is referenced to power supply terminal 366 operating at ground potential. Resistor 370 is coupled between node 372 at the drain of transistor 360 and power supply terminal 374 operating at a positive voltage V$_{DD}$. Resistor 376 is coupled between node 378 at the drain of transistor 362 and power supply terminal 374. The drains of transistors 380 and 382 are coupled to nodes 378 and 372, respectively. The threshold enable control signal is applied to the gates of transistors 380 and 382. The sources of transistors 380 and 382 are coupled to digital-to-analog converter (DAC) 384. Node 378 is the OUT$^+$ of amplifier 312, and node 372 is the OUT$^-$ of the comparator.

At the beginning of preamble 144, the threshold enable control signal goes high to turn on transistors 380 and 382 and connect DAC 384 to node 372 and 378 to enable the threshold function. Transistors 380 and 382 operate as a switch between DAC 384 and nodes 372, 278. When enabled, DAC 384 steers current in response to DAC threshold through transistors 380 and 382 to create a threshold offset between nodes 372 and 378. Assume differential data D$^+$-D$^-$ is less than differential threshold T$^+$-T$^-$. Resistor 376 conducts more current than resistor 370. Node 372 is a higher voltage than node 378 because more voltage is dropped across resistor 376 (transistors 362 and 380 pull down more on node 378). OUT$^-$ is a higher voltage than OUT$^+$, hence the differential output OUT$^+$-OUT$^-$ of differential amplifier 312 is low. As differential data D$^+$-D$^-$ increases, resistor 370 now conducts more current than resistor 376. Node 378 is a higher voltage than node 372 because more voltage is dropped across resistor 370 (transistors 360 and 382 pull down more on node 372). Once the current through resistor 370 exceeds the threshold steering current from DAC 384, OUT$^+$ goes to a higher voltage than OUT$^-$. The differential output OUT$^+$-OUT$^-$ of differential amplifier 312 goes high.

DAC 384 operate as a current steering circuit to establish a threshold for the differential amplifier 360-376 by creating an offset that differential data signal 140 must exceed, i.e., the different threshold, to switch the differential output OUT$^+$ and OUT$^-$. The output of converter 318 goes to logic one to set flipflop 320. The Q output of flipflop 320 goes to logic one to assert signal detect SD as logic one. When the differential data D$^+$-D$^-$ drops below the threshold, OUT$^-$ is a higher voltage than OUT$^+$ as described above, hence the differential output OUT$^+$-OUT$^-$ of differential amplifier 312 is low. Signal detect SD remains asserted until reset by nature of flipflop 320.

Once SD is asserted, the threshold enable control signal goes low to turn off transistors 380 and 382. The threshold function is disabled and transistors 360 and 362 of amplifier 312 operate as a simple differential amplifier. The primary data signal path is through amplifier 312 (with the comparator function disabled) and amplifiers 314 and 316 to BM CDR 132.

In summary, the differential comparator detects when the data signal exceeds a threshold and asserts signal detect SD. The differential comparator reduces the effect of gain error and any variation of the gain does not deteriorate the accuracy of assertion of signal detect SD. The higher the gala, the more accurate the solution of signal detect SD.

While one or more embodiments of the present invention have been illustrated in detail, the skilled artisan will appreciate that modifications and adaptations to those embodiments may be made without departing from the scope of the present invention as set forth in the following claims.

What is claimed:
1. A signal detection circuit, comprising:
  a differential comparator including a first input and second input coupled for receiving a differential data signal, and a third input and fourth input coupled for receiving a differential threshold signal; and
  a latch having an input coupled to an output of the differential comparator for latching a detected signal.
2. The signal detection circuit of claim 1, further including an amplifier comprising an input coupled to the output of the differential comparator and an output coupled to the input of the latch.
3. The signal detection circuit of claim 1, further including an amplifier comprising an input coupled to the output of the differential comparator and an output providing the data signal.
4. The signal detection circuit of claim 1, wherein the differential comparator includes:

a first transistor including a control terminal coupled for receiving a first polarity of the data signal;

a second transistor including a control terminal coupled for receiving a second polarity of the data signal;

a first current source including an output coupled to a first conduction terminal of the first transistor and a first conduction terminal of the second transistor;

a first resistor coupled between a power supply conductor and a second conduction terminal of the first transistor at a first node; and a second resistor coupled between the power supply conductor and a second conduction terminal of the second transistor at a second node.

5. The signal detection circuit of claim 4, wherein the differential comparator further includes:

a third transistor including a control terminal coupled for receiving a first polarity of the threshold signal and a first conduction terminal coupled to the first node;

a fourth transistor including a control terminal coupled for receiving a second polarity of the threshold signal and a first conduction terminal coupled to the second node; and a second current source including an output coupled to a second conduction terminal of the third transistor and a second conduction terminal of the fourth transistor.

6. The signal detection circuit of claim 5, further including a switching circuit coupled between the output of the second current source and the second conduction terminal of the third transistor and the second conduction terminal of the fourth transistor.

7. A signal detection circuit, comprising:

a first differential amplifier including a first input and second input coupled for receiving a differential data signal;

a current steering circuit including a first input and second input coupled to a first output and second output of the first differential amplifier, respectively, to establish a differential threshold for the first differential amplifier such that a differential output signal of the first differential amplifier has a first logic state when the differential data signal is less than the differential threshold signal and the differential output signal of the first differential amplifier has a second logic state when the differential data signal is greater than the differential threshold signal; and a latch having an input coupled for receiving the differential output signal for latching a detected signal based on the first logic state or second logic state of the differential output signal.

8. The signal detection circuit of claim 7, further including a second amplifier comprising a first input coupled to the first output of the first differential amplifier and a second input coupled to the second output of the first differential amplifier and an output coupled to the input of the latch.

9. The signal detection circuit of claim 7, wherein the first differential amplifier includes:

a first transistor including a control terminal coupled for receiving a first polarity of the data signal;

a second transistor including a control terminal coupled for receiving a second polarity of the data signal;

a first current source including an output coupled to a first conduction terminal of the first transistor and a first conduction terminal of the second transistor;

a first resistor coupled between a power supply conductor and a second conduction terminal of the first transistor at a first node; and a second resistor coupled between the power supply conductor and a second conduction terminal of the second transistor at a second node.

10. The signal detection circuit of claim 9, wherein the current steering circuit includes:

a third transistor including a control terminal coupled for receiving a first polarity of the threshold signal and a first conduction terminal coupled to the first node;

a fourth transistor including a control terminal coupled for receiving a second polarity of the threshold signal and a first conduction terminal coupled to the second node; and a second current source including an output coupled to a second conduction terminal of the third transistor and a second conduction terminal of the fourth transistor.

11. The signal detection circuit of claim 10, further including a switching circuit coupled between the output of the second current source and the second conduction terminal of the third transistor and the second conduction terminal of the fourth transistor.

12. The signal detection circuit of claim 9, wherein the current steering circuit includes a digital to analog converter (DAC) comprising a first terminal coupled to the first node and a second terminal coupled to the second node.

13. The signal detection circuit of claim 12, further including a switching circuit coupled between the first terminal of the DAC and the first node and between the second terminal of the DAC and the second node.

14. A method of making a semiconductor device including a signal detection circuit, comprising:

providing a first differential amplifier including a first input and second input coupled for receiving a differential data signal;

providing a current steering circuit including a first input and second input coupled to a first output and second output of the first differential amplifier to establish a differential threshold for the first differential amplifier such that a differential output signal of the first differential amplifier has a first logic state when the differential data signal is less than the differential threshold signal and the differential output signal of the first differential amplifier has a second logic state when the differential data signal is greater than the differential threshold signal; and providing a latch having an input coupled for receiving the differential output signal for latching a detected signal based on the first logic state or second logic state of the differential output signal.

15. The method of claim 14, further including providing a second amplifier comprising a first input coupled to the first output of the first differential amplifier and a second input coupled to the second output of the first differential amplifier and an output coupled to the input of the latch.

16. The method of claim 14, wherein providing the first differential amplifier includes:

providing a first transistor including a control terminal coupled for receiving a first polarity of the data signal;

providing a second transistor including a control terminal coupled for receiving a second polarity of the data signal;

providing a first current source including an output coupled to a first conduction terminal of the first transistor and a first conduction terminal of the second transistor;

providing a first resistor coupled between a power supply conductor and a second conduction terminal of the first transistor at a first node; and providing a second resistor coupled between the power supply conductor and a second conduction terminal of the second transistor at a second node.

17. The method of claim 16, wherein providing the current steering circuit includes:
   providing a third transistor including a control terminal coupled for receiving a first polarity of the threshold signal and a first conduction terminal coupled to the first node;
   providing a fourth transistor including a control terminal coupled for receiving a second polarity of the threshold signal and a first conduction terminal coupled to the second node; and
   providing a second current source including an output coupled to a second conduction terminal of the third transistor and a second conduction terminal of the fourth transistor.

18. The method of claim 17, further including providing a switching circuit coupled between the output of the second current source and the second conduction terminal of the third transistor and the second conduction terminal of the fourth transistor.

19. The method of claim 16, wherein providing the current steering circuit includes providing a digital to analog converter (DAC) comprising a first terminal coupled to the first node and a second terminal coupled to the second node.

20. The method of claim 19, further including providing a switching circuit coupled between the first terminal of the DAC and the first node and between the second terminal of the DAC and the second node.

* * * * *